(12) United States Patent
Ng et al.

(10) Patent No.: US 8,035,119 B2
(45) Date of Patent: Oct. 11, 2011

(54) SYSTEM AND METHOD FOR LIGHT SOURCE WITH DISCONTINUITY-CONTAINING DIFFUSANT

(75) Inventors: Fook Chin Ng, Penang (MY); Siew It Pang, Penang (MY); Ju Chin Poh, Jahore (MY); Sundar A. L. N. Yoganandan, Penang (MY); Tong Fatt Chew, Penang (MY); Thye Linn Mok, Penang (MY)

(73) Assignee: Avago Technologies General IP Pte, Ltd., Singapore (SG)

( * ) Notice: Subject to any disclaimer, the term of this patent is extended or adjusted under 35 U.S.C. 154(b) by 1108 days.

(21) Appl. No.: 11/542,356

(22) Filed: Oct. 3, 2006

(65) Prior Publication Data

US 2008/0079014 A1 Apr. 3, 2008

(51) Int. Cl.
*H01L 29/22* (2006.01)
*H01L 29/24* (2006.01)

(52) U.S. Cl. ............................. 257/98; 257/88; 257/100
(58) Field of Classification Search .................... 257/88, 257/89, 91, 98, 99, 100, E51.02, E51.022, 257/E33.059, E33.074
See application file for complete search history.

(56) References Cited

U.S. PATENT DOCUMENTS

2004/0217364 A1* 11/2004 Tarsa et al. ...................... 257/89
* cited by examiner

*Primary Examiner* — Hung Vu

(57) ABSTRACT

A discontinuity-containing, light-diffusing substrate is placed within an LED light source. In one embodiment, the substrate is placed between an LED light source and a light guide. The light diffusing substrate may include a plurality of air bubbles, grooves or both, effective to mix the colored light and yield a white light exiting the light guide. Methods of constructing optical devices and light sources having a bubble-containing substrate are also disclosed.

9 Claims, 2 Drawing Sheets

SYSTEM AND METHOD FOR LIGHT SOURCE WITH DISCONTINUITY-CONTAINING DIFFUSANT

TECHNICAL FIELD

The invention relates to a light source and more particularly to a light-emitting diode light source in association with a discontinuity diffusant to improve light mixing.

BACKGROUND OF THE INVENTION

Light emitting diodes (LEDs) generally emit light in a specific color or range of wavelengths. To produce a white light, it is usually necessary to combine or mix the light from multiple LEDs which emit different colors, for example, red, green and blue. Initially, light mixing was accomplished by placing LEDs of different colors next to each other such that the light emitted by each LED would mix with the light from the others. A common structure associated with such mixing is a light guide. This approach has several drawbacks including poor color mixing, uneven light intensity, and the presence of dark regions near the edges of the light guide plate.

Several techniques exist to improve the light mixing needed to produce white light. One is the insertion of LEDs in a mixing cavity within the light guide. Another is the use of a light diffusant layer to mix the colors. However, known light diffusant layers significantly reduce output of the light sources. While these techniques have resulted in slightly better color mixing, there remains a need for further improvement.

BRIEF SUMMARY OF THE INVENTION

The present invention is directed to systems and methods for producing a well-mixed white light from a plurality of colored light sources. A white light source is constructed by combining a plurality of colored light sources with a light discontinuity diffusant layer. In one embodiment, the discontinuity can be an air bubble. The bubble-containing diffusant allows for effective mixing of the light generated by the light sources contained within the light source. In one embodiment, a light source is arranged with light sources, each of which emit light of a different color, and one or more encapsulating layers, including a bubble-containing layer.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims. The novel features which are believed to be characteristic of the invention, both as to its organization and method of operation, together with further objects and advantages will be better understood from the following description when considered in connection with the accompanying figures. It is to be expressly understood, however, that each of the figures is provided for the purpose of illustration and description only and is not intended as a definition of the limits of the present invention.

BRIEF DESCRIPTION OF THE DRAWINGS

For a more complete understanding of the present invention, reference is now made to the following descriptions taken in conjunction with the accompanying drawing, in which.

DETAILED DESCRIPTION OF THE INVENTION

Figure 4:
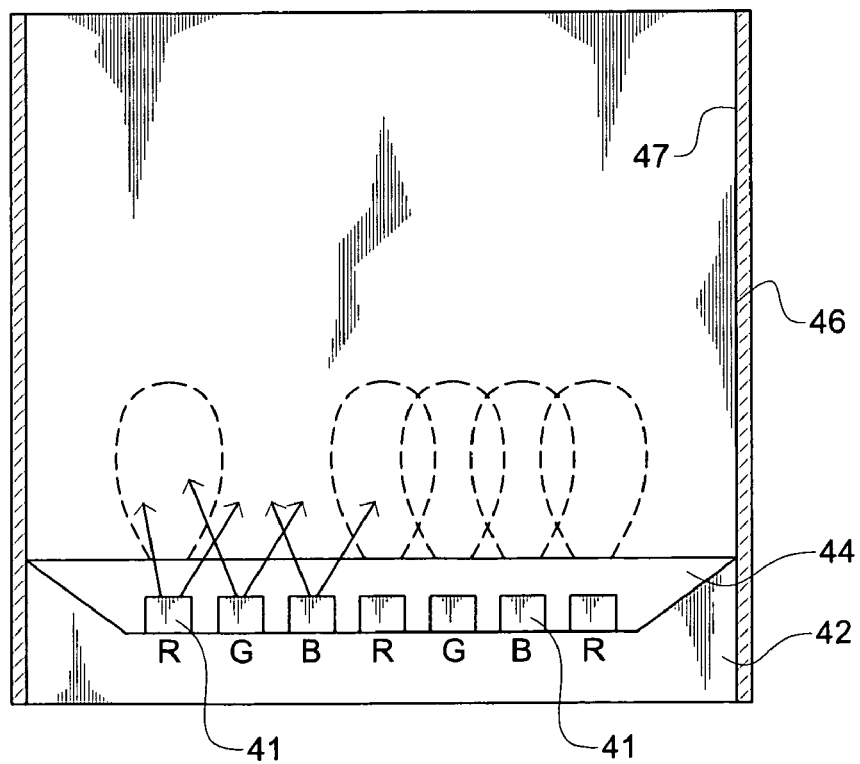
FIG. 4 is a is a cross-sectional view of a prior art light source.

A brief discussion of a prior art light source may be useful. FIG. 4 shows an embodiment 40 of a prior art light source having a plurality of differently colored LED dice 41 arranged on light source body 42. Light source 40 utilizes multiple colored LED dice 41 to create white light. Encapsulant 44 may be used to protect LED dice 40. LED dice 40 may include LED dice for producing red, green, and blue light. Light guide 46 having walls 47 for controlling light emission is coupled to body 42 and receives light emitted from LED dice 40. Insufficient light mixing may result in a nonuniform colored light. Colored blotches may appear (shown by broken lines) at the base of light guide 46 as a result of insufficient light mixing. These colored blotches or hot spots typically reduce the quality of light produced by the LED light source.

Figure 1:
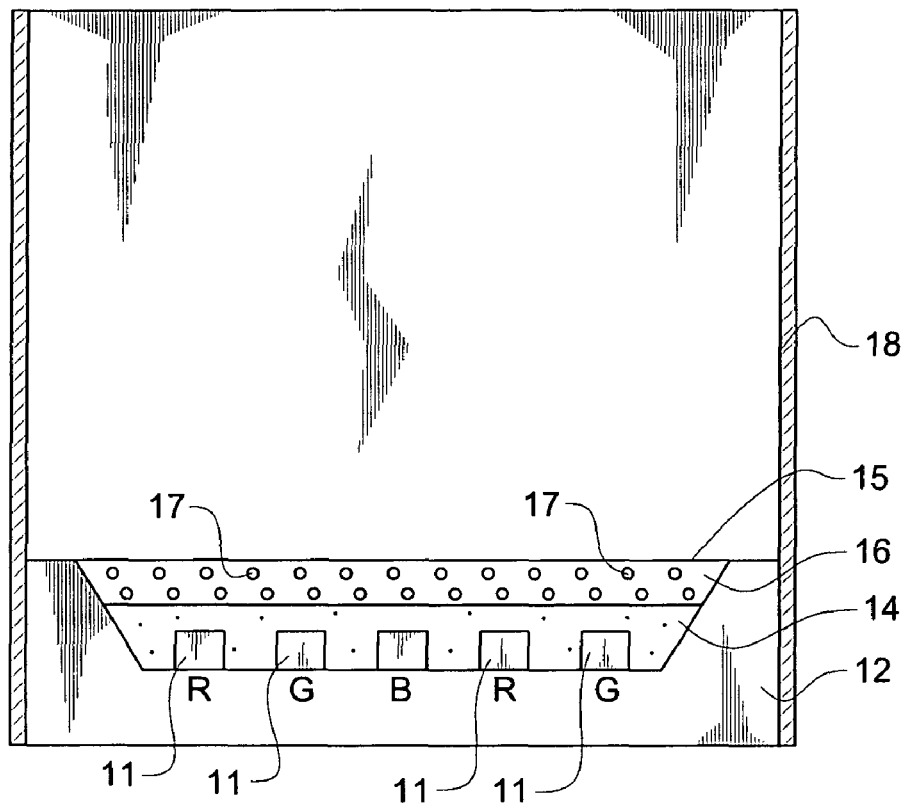
FIG. 1 is a cross-sectional view of an embodiment of the present invention.

FIG. 1 shows a cross-sectional view of one embodiment 10 of a light source having an array of LED dice 11 arranged on light source body 12. LED dice 11 may be arranged in a particular pattern and produce various colored light. In the embodiment shown, a generally transparent first encapsulant layer 14 is provided directly upon LED dice 11. A light diffusing element 15 is embodied as a second encapsulant layer provided over first encapsulant layer 14. Second encapsulant layer 15 includes a generally transparent substrate 16 containing a plurality of air bubbles 17. Bubbles 17 are, in effect, discontinuities between one medium and another which serve to diffuse the light, resulting in a better mix of the colors. Light guide 18 is connected to body 12 and receives light emitted from LED dice 11. Bubbles 17 of second encapsulant layer 15 effectively diffuse light from dice 11 to yield a white light source with improved uniformity. In another embodiment of the invention (not shown), first and second encapsulant layers 14, 15 can be combined into a single encapsulant layer having a plurality of air bubbles contained therein.

Figure 2:
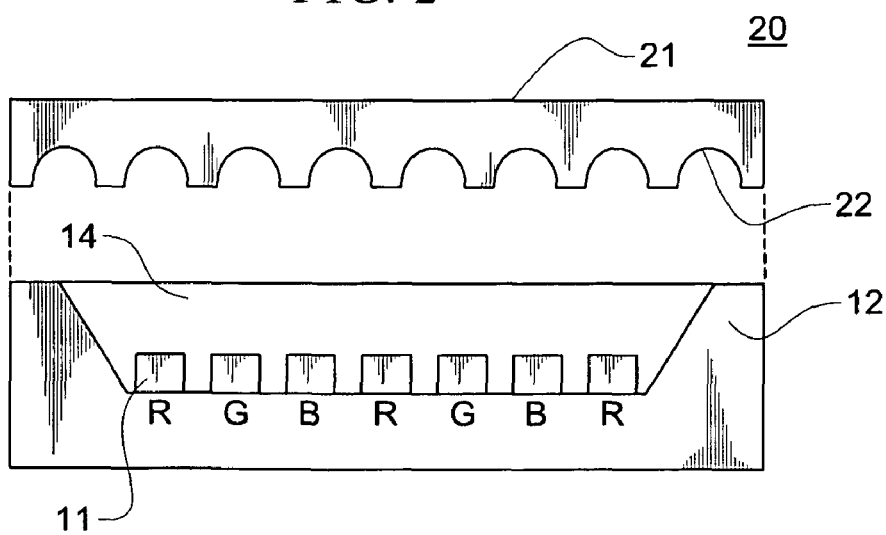
FIG. 2 is an exploded cross-sectional view of an alternate embodiment of the present invention.

FIG. 2 shows an exploded cross-sectional view of another light source embodiment 20 having grooved substrate 21. In the embodiment shown, grooves 22 are defined upon a surface of substrate 20. With substrate 20 overlaid upon first encapsulant layer 14, grooves 22 create medium discontinuities, here embodied as air gaps, which diffuse and redirect light emitted from LED dice 11. Grooves 22 may be considered elongated bubble elements and may be closed at ends of substrate 20.

In operation, LED dice 11 (FIG. 1) produces colored lights, typically red, green and/or blue which are used to create a white light for communication into light guide 18. Discontinuities, such as air bubbles 17 or grooves 22, effectively diffuse colored light emanating from LED dice 11 prior to introduction into light guide 18. Consequently, embodiments of the present invention can produce a well-mixed white light, preferably devoid of color blotches.

Figure 3:
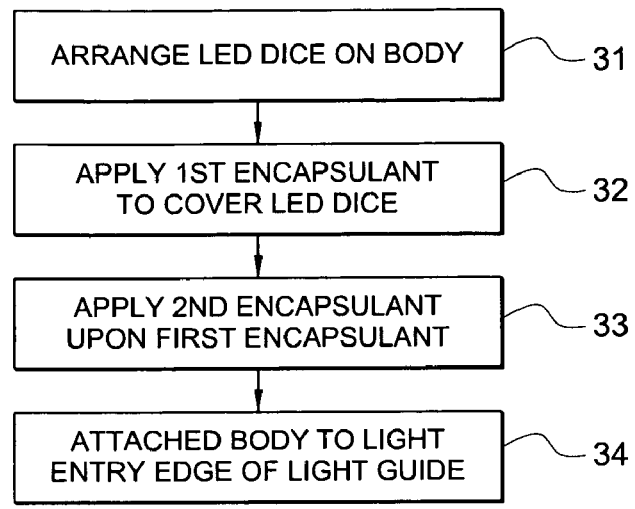
FIG. 3 shows a flow chart of a manufacturing process.

FIG. 3 shows a manufacturing process flow chart 30 in accordance with an embodiment of the invention. In an initial step 31, LED dice are arranged on a body in a pattern which enhances color mixing and minimizes heat build up. At step 32, the first encapsulant layer is placed over the LED dice. The first encapsulant layer is of clear resin, epoxy or silicon material. The first encapsulant layer may be a curable liquid resin which flows into intimate contact with individual LEDs and which is subsequently hardened. At step 33, a second encapsulant layer containing discontinuities (such as bubbles) is placed over the first encapsulant layer. The second encapsulant layer may be a sheet laminate which overlays the first encapsulant layer. The sheet laminate may be a cured resin, such as an epoxy or silicone. At step 34, the body is connected at a light entry edge of the light guide.

In another embodiment, the second encapsulant layer may be manufactured by introducing water into a laminate resin. The resin may then be cured at appropriate temperatures and pressures to create and/or maintain water and/or air bubbles within the cured resin. An alternative method of creating the second encapsulant layer may include vigorously stirring a resin to entrain air bubbles, forming the resin into a sheet form, and quickly curing the sheet, for example, in a heated vacuum chamber. Bubbles within the encapsulant layer may be generally spherical or may assume alternative configurations or shapes. The bubbles need not necessarily be air bubbles, but may be defined by other fluids, for example by introduction of bubble-generating fluids within the second encapsulant layer.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed that perform substantially the same function or achieve substantially the same result as the corresponding embodiments described herein may be utilized according to the present invention. Accordingly, the appended claims are intended to include within their scope such processes, machines, manufacture, compositions of matter,

What is claimed is:

1. A light source comprising:
a plurality of light-emitting-diodes (LEDs), each emitting a different color light; and
a substrate containing discontinuities in light communication with said plurality of LEDs, wherein colored light from said plurality of LEDs passes into and is mixed at least in part by said discontinuities contained in said substrate;
wherein said discontinuities are bubbles and wherein said bubbles are air bubbles.

2. The light source of claim 1 wherein said substrate is provided between said plurality of LEDS and a light guide.

3. A light source comprising:
a plurality of light-emitting-diodes (LEDs), each emitting a different color light; and
a substrate containing discontinuities in light communication with said plurality of LEDs, wherein colored light from said plurality of LEDs passes into and is mixed at least in part by said discontinuities contained in said substrate, and wherein said substrate is an air-entrained cured liquid resin.

4. An optical device comprising:
a light guide; and a light source associated with a light entry edge of said light guide wherein said light source comprises:
one or more light-emitting diode chips attached to a substrate;
an encapsulant at least partially encapsulating said chips; and
a layer having therein discontinuities associated with a surface of said encapsulant, wherein said discontinuities comprise air bubbles.

5. The optical device of claim 4 wherein said layer is an air-entrained cured liquid resin.

6. A light device comprising:
a plurality of light sources, each light source emitting a different color light; and
a bubbled substrate for mixing colored light from said plurality of light sources so as to produce a desired output color, wherein said bubbled substrate comprises a generally transparent substrate containing a plurality of air bubbles.

7. The light device of claim 6 wherein said bubbled substrate is an encapsulating layer.

8. The light device of claim 7 wherein said encapsulating layer is adjacent another layer encapsulating said plurality of light sources.

9. A light device comprising:
a plurality of light sources, each light source emitting a different color light; and
a bubbled substrate for mixing colored light from said plurality of light sources so as to produce a desired output color, wherein said bubbled substrate is an encapsulating layer and wherein said bubbled substrate is an air-entrained cured liquid resin.

* * * * *